(12) United States Patent
Cho et al.

(10) Patent No.: US 6,709,916 B2
(45) Date of Patent: Mar. 23, 2004

(54) METHOD FOR FORMING CAPACITOR OF SEMICONDUCTOR DEVICE

(75) Inventors: Kwang Jun Cho, Seoul (KR); Ki Seon Park, Kyoungki-do (KR); Kyong Min Kim, Kyoungki-do (KR); Dong Woo Shin, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/330,583

(22) Filed: Dec. 27, 2002

(65) Prior Publication Data
US 2003/0134484 A1 Jul. 17, 2003

(30) Foreign Application Priority Data
Dec. 31, 2001 (KR) ........................... 2001-89083

(51) Int. Cl.[7] .......................................... H01L 21/8242
(52) U.S. Cl. ........................ 438/240; 438/3; 438/253
(58) Field of Search ........................... 438/3, 238–240, 438/253–256, 381, 396–399

(56) References Cited

U.S. PATENT DOCUMENTS 5,256,455 A    10/1993  Numasawa
6,313,047 B2 *  11/2001  Hasebe et al. ............... 438/785

* cited by examiner

Primary Examiner—H. Jey Tsai
(74) Attorney, Agent, or Firm—Marshall, Gerstein & Borun LLP

(57) ABSTRACT

A method for forming a capacitor of a semiconductor device having a dielectric film of high dielectric constant having three-dimensional structure for securing capacitance of semiconductor device in order to have excellent deposition characteristics, by forming a storage electrode formed of Ru film on a semiconductor substrate and forming dielectric films formed of high dielectric constant materials having excellent step coverage on the surface of the storage electrode, the dielectric films having a stacked structure of a first dielectric film formed at low deposition speed and a second dielectric film formed at higher deposition speed by reducing the amount of added gas, thereby performing the subsequent process easily and improving yield and productivity of semiconductor device and then embodying high integration of semiconductor device.

24 Claims, 4 Drawing Sheets

METHOD FOR FORMING CAPACITOR OF SEMICONDUCTOR DEVICE

BACKGROUND

1. Technical Field

Methods for forming a capacitor having a storage electrode are disclosed wherein the capacitor is formed of ruthenium (hereinafter, referred to as 'Ru') film, and more particularly, methods for forming a capacitor having a storage electrode formed of Ru film whereon dielectric films having the excellent deposition characteristics are formed using high dielectric constant materials such as $Ta_2O_5$ film, BST film, PZT film, SBT film or BLT film.

1. Description of the Related Art

As the cell size is decreased due to high integration of semiconductor devices, it is difficult to obtain sufficient capacitance proportional to the surface area of storage electrode.

Specifically, in case of high integration of DRAM device having a unit cell consisting of a MOS transistor and a capacitor, the significant factor for high integration is to increase the capacitance of a capacitor which occupies much space of unit cell.

Accordingly, a convenient method of increasing the capacitance of a capacitor following the equation of (Eo× Er×A)/T (Eo: permitivity of vacuum, Er: dielectric constant of dielectric film, A: surface area of capacitor, T: thickness of dielectric film) is to minimize the thickness T of dielectric film by thinning the dielectric film or to increase the surface area A of capacitor by forming the capacitor having three dimensional structures such as concave type or cylinder type.

However, high integration of semiconductor devices results in limit of the process for forming a capacitor. In order to overcome the limit, a dielectric film having high dielectric constant is selected from the group consisting of $Ta_2O_5$ film, BST film, PZT film, SBT film or BLT film instead of the conventional dielectric film formed of silicon.

Additionally, as the dielectric films having high dielectric constant are used, storage electrodes are formed of iridium film, platinum film or conductive oxide film as well as Ru film.

Although not shown in the drawings, a conventional method for forming a capacitor of a semiconductor device is described.

First, a planarized lower insulating layer is first formed on a semiconductor substrate comprising a device isolation film, a word line and a bit line.

The lower insulating layer is formed of insulating materials having high fluidity such as BPSG (Boro Phospho Silicate Glass).

A storage electrode contact hole is formed to expose a predetermined portion of the semiconductor substrate.

The storage electrode contact hole is formed by etching the lower insulating layer via a photo-etching process using a storage electrode contact mask.

Then, a contact plug is formed to fill the storage electrode contact hole.

The contact plug comprises a stacked structure of polysilicon film/Ti film/TiN film.

After a sacrificial insulating film is formed on the entire surface of the resultant structure, a trench-type storage electrode region is formed by etching the sacrificial insulating layer via a photo-etching process using a storage electrode contact mask.

A Ru film, metal layer for lower electrode connected to the contact plug is formed on the entire surface of the resultant structure. Here, the Ru film is deposited via a chemical vapor deposition (hereinafter, referred to as 'CVD') method.

A storage electrode is formed of the Ru film remaining on the surface of the storage electrode region via the planarization etching process.

A dielectric film, $Ta_2O_5$ film, is formed on the entire surface of the resultant structure including the storage electrode formed of Ru film via a MOCVD (metal organic chemical vapor deposition) method. Here, the $Ta_2O_5$ film reacts with Ru film and then rapidly grows on the top side of the storage electrode region, thereby resulting in overhang phenomenon (see FIG. 1).

Recently, in order to overcome the overhang phenomenon generated from the process of depositing dielectric films, the following process steps are used:

1. reducing the whole deposition speed by lowering the chamber temperature;
2. reducing the reaction speed of source and electrode surface by reducing the amount of source;
3. reducing the reaction speed of source and reactant gas by reducing the amount of reactant gas; and
4. reducing the partial pressure of source by increasing the amount of carrier gas.

However, the low deposition speed due to the step 1 results in degradation of film quality and throughput characteristics. Although the steps 2, 3 and 4 may improve step coverage, the decrease of deposition speed in the steps also results in throughput characteristics.

As described above, the conventional method for forming a capacitor of a semiconductor device generates the overhang phenomenon when dielectric films of high dielectric constant are formed on storage electrode formed of Ru film having the three dimensional structure. As a result, it is impossible to perform the subsequent process, and yield and productivity of device are degraded.

SUMMARY OF THE DISCLOSURE

Accordingly, a method for forming a capacitor is disclosed wherein the capacitor comprises a dielectric film formed via two-step deposition process to have excellent deposition characteristics, thereby improving yield and productivity of semiconductor device and embodying high integration of semiconductor device.

One disclosed method for forming a capacitor having a Ru storage electrode on a semiconductor device comprising:

(a) forming a storage electrode consisting of Ru on a semiconductor substrate;

(b) forming dielectric films on the storage electrode, the dielectric films comprising a stacked structure of a first dielectric film and a second dielectric film formed at a different deposition rate from the first dielectric film; and (c) forming an upper electrode on the dielectric film.

A ratio of deposition rate of the first dielectric film:the second dielectric film falls within the range of 1:1.5~10.

The deposition rate of the first dielectric film is ranging from 1 to 10 Å/min and the deposition rate of the second dielectric film is ranging from 5 to 50Å/min.

A partial pressure of source gas in the formation process of the first dielectric film is lower than that of source gas in the formation process of the second dielectric film.

The ratio of a partial pressure of source gas in the formation process of the first dielectric film:the second dielectric film falls within the range of 1:1.5~100.

The formation process of the first dielectric film is performed by a MOCVD method under the conditions of:

1) at a chamber temperature ranging from 250 to 750° C.;
2) using a source selected from the group consisting of $Ta(OC_2H_5)_5$, $Ba(METHD)_2$, $Sr(METHD)_2$, $Ti(MPD)(THD)_2$ and mixtures thereof which is subject to inflow into a reaction chamber at a flow rate ranging from 0.001 to 0.1 g/min;
3) using an inert gas as a carrier gas which is subject to inflow into the reaction chamber at a flow rate ranging from 10 to 1000 sccm as a carrier gas; and
4) using a reactant gas selected from the group consisting of $O_2$, $N_2$, $N_2O$, $NH_3$ and mixtures thereof which is subject to inflow into the reaction chamber at a flow rate ranging from 1 to 1000 sccm.

The inert gas is selected from the group consisting of $N_2$, Ar, Xe and mixtures thereof.

The method further comprises a step of performing a thermal treatment process onto the dielectric film after the step (b), using at least one process selected from the group consisting of plasma treatment, UV—$O_3$ treatment, RTP annealing, furnace annealing and combinations thereof.

The step (b) is repeatedly performed more than 2 times.

There is also provided a method for forming a capacitor having a Ru storage electrode on a semiconductor device comprising:

(a) forming and selectively patterning a sacrificial layer on a semiconductor substrate to form a trench;
(b) forming a diffusion barrier layer and a storage electrode on the resultant sutructure;
(c) forming dielectric films on the storage electrode, the dielectric films comprising a stacked structure of a first dielectric film and a second dielectric film formed at a different deposition rate from the first dielectric film; and
(d) forming an upper electrode on the surface of the dielectric film.

A ratio of deposition rate of the first dielectric film:the second dielectric film falls within the range of 1:1.5~10.

The deposition rate of the first dielectric film is ranging from 1 to 10 Å/min and the deposition rate of the second dielectric film is ranging from 5 to 50 Å/min.

A partial pressure of source gas in the formation process of the first dielectric film is lower than that of source gas in the formation process of the second dielectric film.

The ratio of a partial pressure of source gas in the formation process of the first dielectric film:the second dielectric film falls within the range of 1:1.5~100.

The formation process of the first dielectric film is performed by a MOCVD method under the conditions of:

1) at a chamber temperature ranging from 250 to 750° C.;
2) using a source selected from the group consisting of $Ta(OC_2H_5)_5$, $Ba(METHD)_2$, $Sr(METHD)_2$, $Ti(MPD)(THD)_2$ and mixtures thereof which is subject to inflow into a reaction chamber at a flow rate ranging from 0.001 to 0.1 g/min;
3) using an inert gas as a carrier gas which is subject to inflow into the reaction chamber at a flow rate ranging from 20 to 6000 sccm; and
4) using a reactant gas selected from the group consisting of $O_2$, $N_2$, $N_2O$, $NH_3$ and mixtures thereof which is subject to inflow into the reaction chamber at a flow rate ranging from 1 to 1000 sccm.

The formation process of the second dielectric film is performed by a MOCVD method under the conditions of:

1) at a chamber temperature ranging from 250 to 750° C.;
2) using a source selected from the group consisting of $Ta(OC_2H_5)_5$, $Ba(METHD)_2$, $Sr(METHD)_2$, $Ti(MPD)(THD)_2$ and mixtures thereof which is subject to inflow into a reaction chamber at a flow rate ranging from 0.001 to 0.1 g/min;
3) using an inert gas as a carrier gas which is subject to inflow into the reaction chamber at a flow rate ranging from 10 to 1000 sccm as a carrier gas; and
4) using a reactant gas selected from the group consisting of $O_2$, $N_2$, $N_2O$, $NH_3$ and mixtures thereof which is subject to inflow into the reaction chamber at a flow rate ranging from 1 to 1000 sccm.

The inert gas is selected from the group consisting of $N_2$, Ar, Xe and mixtures thereof.

The method further comprises a step of performing a thermal treatment process onto the dielectric film after the step (c), using at least one process selected from the group consisting of plasma treatment, UV—$O_3$ treatment, RTP annealing, furnace annealing and combinations thereof.

The step (c) is repeatedly performed more than 2 times.

An important principle of the disclosed methods is to deposit a first dielectric film having a predetermined thickness on a storage electrode at low deposition speed by regulating the amount of added gas and source under a predetermined chamber temperature and then deposit a second dielectric film having a predetermined thickness on the first dielectric film at high deposition speed, thereby obtaining dielectric films having a stacked structure.

Here, the process of depositing the first dielectric film is performed at low deposition speed ranging from 1 to 10 Å/min by adding a large amount of inert gas or decreasing the amount of source.

Also, the process of depositing the second dielectric film is performed at higher deposition speed ranging from 5 to 50 Å/min and having the same amount of source of the first step by inhibiting inflow of a large amount of carrier gas or inert gas added therein.

DETAILED DESCRIPTION OF THE PREFERRED EMBODIMENTS

The disclosed methods for forming a capacitor of a semiconductor device will be described in more detail referring to accompanying drawings.

FIGS. 2a to 2d are cross-sectional diagrams illustrating a method for forming a capacitor of a semiconductor substrate in accordance with a preferred embodiment. Here, a concave-type capacitor is explained.

Figure 1:
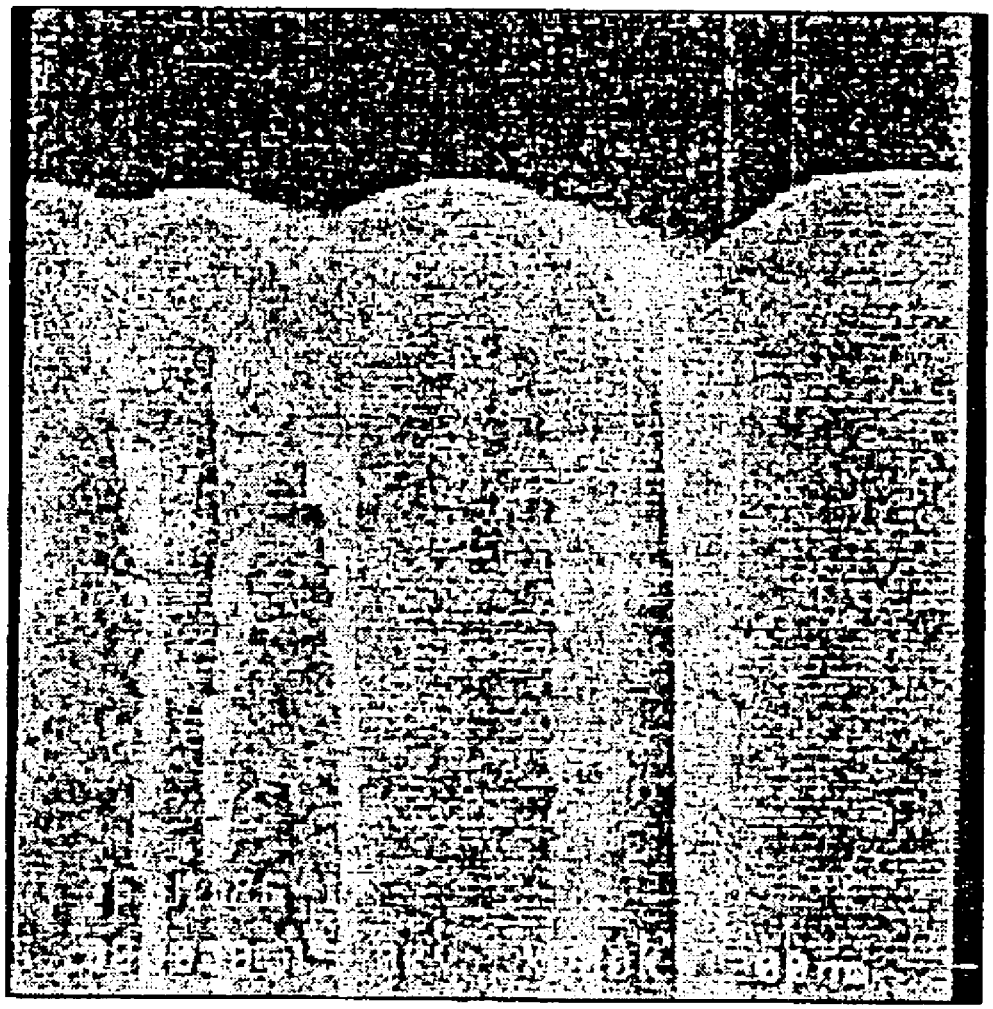
FIG. 1 is a TEM photograph illustrating a conventional dielectric film.
Figure 2A:
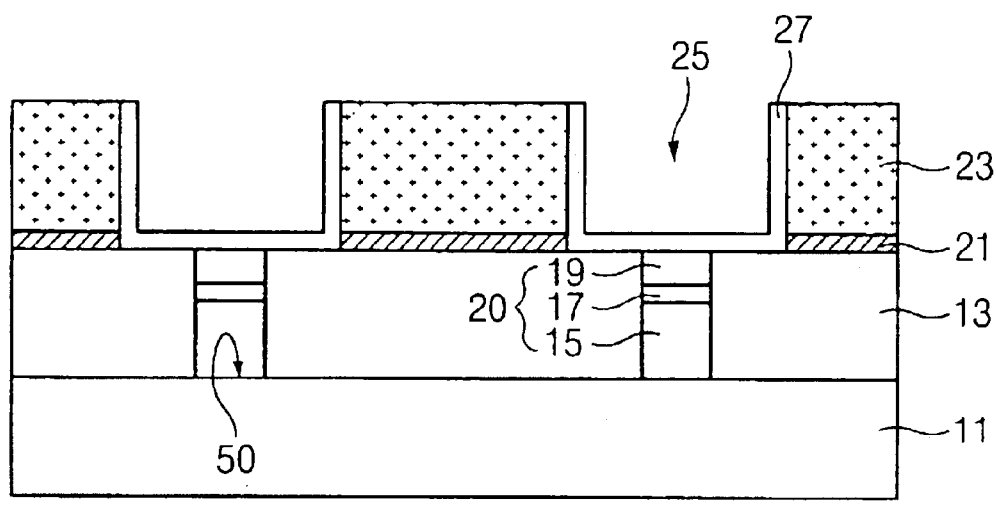
FIGS. 2a to 2d are cross-sectional diagrams illustrating a method for forming a capacitor of a semiconductor substrate in accordance with a preferred embodiment.

Referring to FIG. 2a, a planarized lower insulating film 13 is formed on a semiconductor substrate 11 comprising a device isolation film (not shown), a word line (not shown) and a bit line (not shown).

The lower insulating layer 13 is formed of insulating materials having high fluidity such as BPSG.

Thereafter, a storage contact hole 50 exposing a predetermined portion of the substrate 11 is formed in the lower insulating layer 13.

The storage electrode contact hole 50 is formed by etching the lower insulating layer 13 via a photo-etching process using a storage electrode contact mask (not shown) to expose the substrate 11.

Next, a contact plug 20 is formed to fill the storage electrode contact hole 50.

Preferably, the contact plug 20 has a stacked structure of a polysilicon film 15, a Ti film 17 and a TiN film 19.

Specifically, the stacked structure is formed by first forming a polysilicon film 15 to fill the whole storage electrode contact hole 50 and then planarizing and over-etching to remove a top portion of the polysilicon film in the contact hole 50. Secondly, a Ti Film 17 is formed thereon and then over-etched. Thirdly, a TiN film 19 is formed thereon and then planarized.

Thereafter, after an etching barrier film 21 is formed on the entire surface of the resultant structure, a sacrificial insulating film 23 is formed thereon.

The sacrificial insulating film 23 is etched via photo-etching process using a storage electrode mask (not shown) to form the sacrificial insulating film 23 pattern for defining a trench-type storage electrode region 25 which exposes top portions of the contact plug 20.

A Ru film 27 connected to the contact plug 20 is formed on the surface of the storage electrode region 25 to form a storage electrode. Here, iridium film, platinum film or conductive oxide film are used instead of the Ru film 27.

Figure 2B:
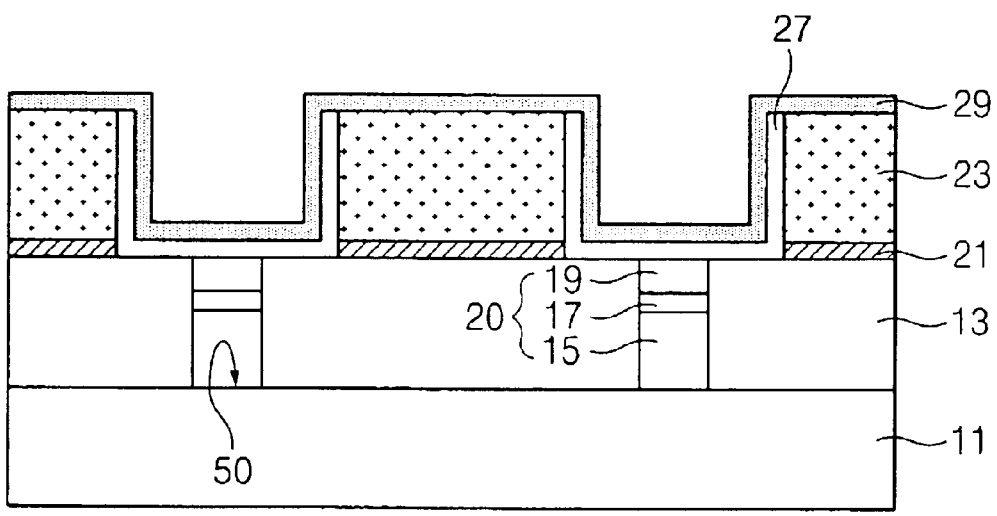

Referring to FIG. 2*b*, a first dielectric film 29 is formed on the entire surface of the resultant structure including the storage electrode region 25.

The first dielectric film is formed at low deposition speed ranging from 1 to 10 Å/min by a MOCVD method under the following conditions:

1) at a chamber temperature ranging from 250 to 750° C.;
2) using a source selected from the group consisting of $Ta(OC_2H_5)_5$, $Ba(METHD)_2$, $Sr(METHD)_2$, $Ti(MPD)(THD)_2$ and mixtures thereof which is subject to inflow into a reaction chamber at a flow rate ranging from 0.001 to 0.1 g/min;
3) using an inert gas as a carrier gas which is subject to inflow into the reaction chamber at a flow rate ranging from 20 to 6000 sccm; and
4) using a reactant gas selected from the group consisting of $O_2$, $N_2$, $N_2O$, $NH_3$ and mixtures thereof which is subject to inflow into the reaction chamber at a flow rate ranging from 1 to 1000 sccm.

Figure 2C:
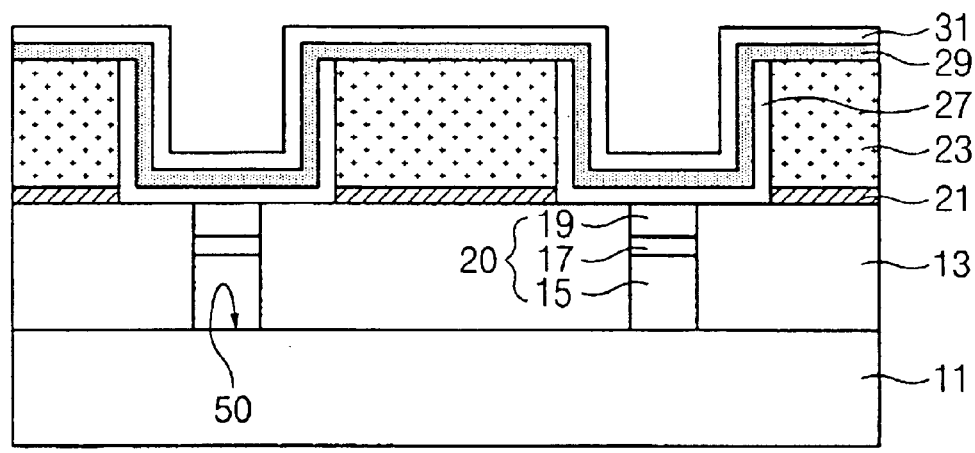

Referring to FIG. 2*c*, a second dielectric film 31 is formed on the first dielectric film 29.

The second dielectric film 31 is formed at higher deposition speed ranging from 5 to 50 Å/min by a MOCVD method under the following conditions:

1) at a chamber temperature ranging from 250 to 750° C.;
2) using a source selected from the group consisting of $Ta(OC_2H_5)_5$, $Ba(METHD)_2$, $Sr(METHD)_2$, $Ti(MPD)(THD)_2$ and mixtures thereof which is subject to inflow into a reaction chamber at a flow rate ranging from 0.001 to 0.1 g/min;
3) using an inert gas as a carrier gas which is subject to inflow into the reaction chamber at a flow rate ranging from 10 to 1000 sccm as a carrier gas; and
4) using a reactant gas selected from the group consisting of $O_2$, $N_2$, $N_2O$, $NH_3$ and mixtures thereof which is subject to inflow into the reaction chamber at a flow rate ranging from 1 to 1000 sccm.

It is preferable that the ratio of deposition rate of the first dielectric film:the second dielectric film falls within the range of 1:1.5~10.

It is preferable that the ratio of a partial pressure of source gas in the formation process of the first dielectric film:the second dielectric film falls within the range of 1:1.5~100

Thereafter, the first and the second dielectric films 29 and 31 are thermally treated using a process selected from the group consisting of plasma treatment, $UV—O_3$ treatment, RTP annealing, furnace annealing and combinations thereof.

Figure 2D:
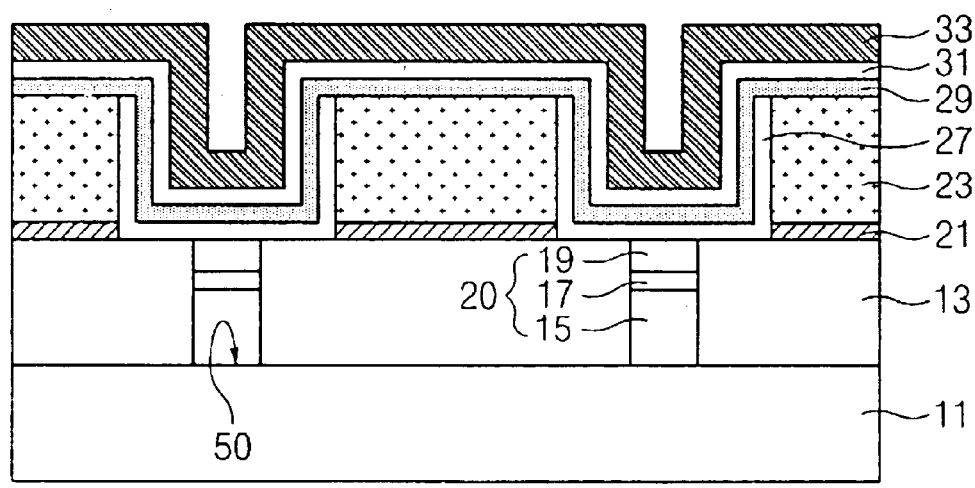

Referring to FIG. 2*d*, an upper electrode 33 is formed on the second dielectric film 31. Here, the upper electrode 33 is selected from the group consisting of Ru film, iridium film, platinum film, conductive oxide film and mixtures thereof.

In another preferred embodiment, a capacitor having a stacked structure of a first and a second dielectric films is manufactured by differently combining the sequence of the process of forming the first dielectric film, the process of forming the second dielectric film and the thermal treatment process or repeating thereof.

For example, the above-described process may be repeated more than one time in the following sequence: the process of forming the first dielectric film, the thermal treatment process, the process of forming the second dielectric film and the thermal treatment process.

Figure 3:
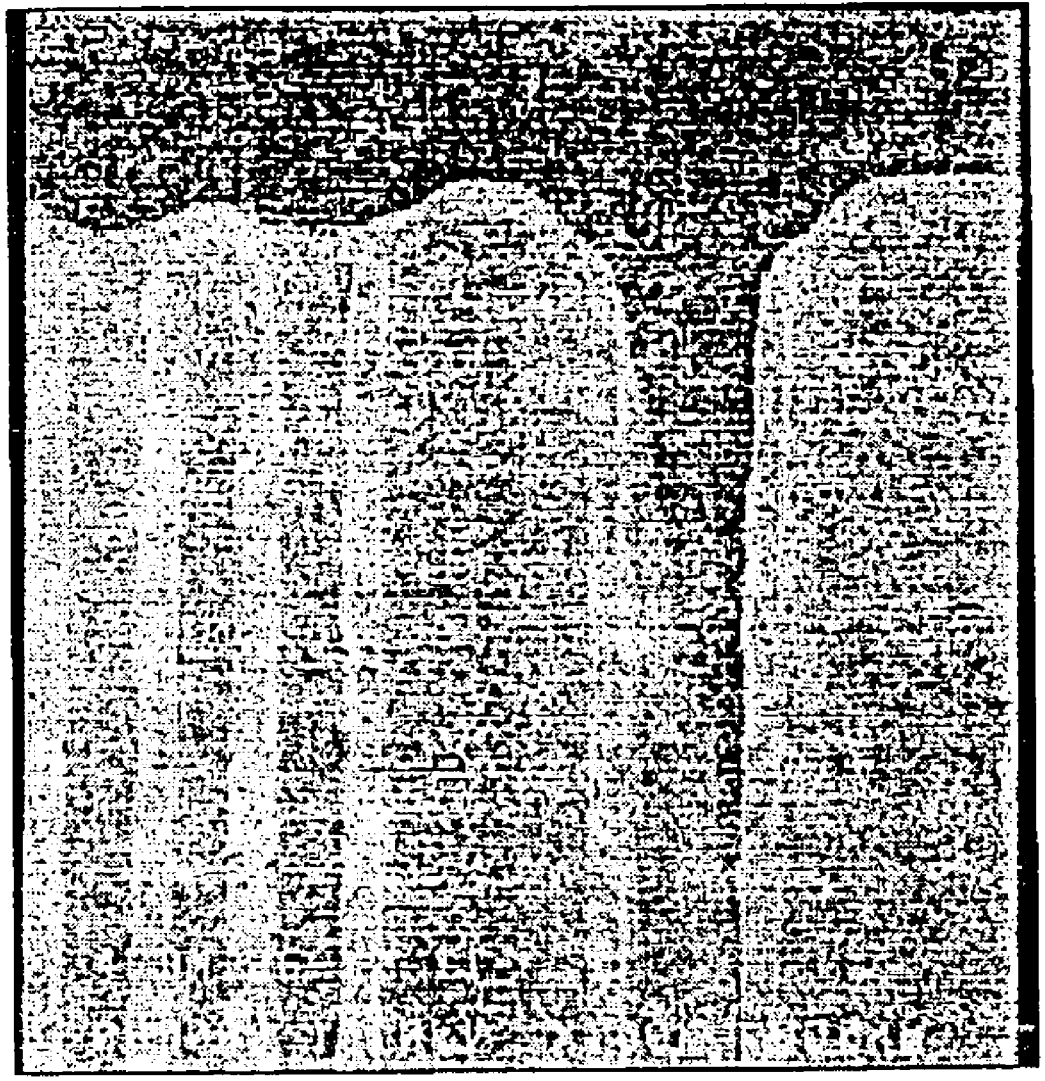
FIG. 3 is a TME photograph illustrating a dielectric film in accordance with the disclosed methodology.

FIG. 3 is a TME photograph illustrating the deposited $Ta_2O_5$ film in accordance with the present invention. Here, it is shown that the $Ta_2O_5$ film is formed having a predetermined thickness.

As discussed earlier, the method for forming a capacitor of a semiconductor device comprising a dielectric film of high dielectric constant formed via two-step deposition process at a predetermined thickness, thereby easily performing the subsequent process and improving reliability and characteristics of semiconductor device and then embodying high integration of semiconductor device.

What is claimed is:

1. A method for forming a capacitor having a Ru storage electrode on a semiconductor device comprising:
   (a) forming and selectively patterning a sacrificial layer on a semiconductor substrate to form a trench;
   (b) forming a storage electrode consisting of Ru in the trench;
   (c) forming dielectric films on the storage electrode, the dielectric films comprising a stacked structure of a first dielectric film and a second dielectric film formed at a different deposition rate from the first dielectric film; and
   (d) forming an upper electrode on the dielectric film.

2. The method according to claim 1, wherein a ratio of deposition rate of the first dielectric film:the second dielectric film falls within the range of 1:1.5~10.

3. The method according to claim 1, wherein the deposition rate of the first dielectric film ranges from 1 to 10 Å/min.

4. The method according to claim 1, wherein the deposition rate of the second dielectric film ranges from 5 to 50 Å/min.

5. The method according to claim 1, wherein a partial pressure of source gas in the formation process of the first dielectric film is lower than that of source gas in the formation process of the second dielectric film.

6. The method according to claim 5, wherein a ratio of a partial pressure of source gas in the formation process of the first dielectric film: the second dielectric film falls within the range of 1:1.5~100.

7. The method according to claim 1, wherein forming the first dielectric film is performed by a MOCVD method under the conditions of:

1) at a chamber temperature ranging from 250 to 750° C.;
2) using a source selected from the group consisting of $Ta(OC_2H_5)_5$, $Ba(METHD)_2$, $Sr(METHD)_2$, $Ti(MPD)(THD)_2$ and mixtures thereof which is subject to inflow into a reaction chamber at a flow rate ranging from 0.001 to 0.1 g/min;
3) using an inert gas as a carrier gas which is subject to inflow into the reaction chamber at a flow rate ranging from 20 to 6000 sccm; and
4) using a reactant gas selected from the group consisting of $O_2$, $N_2$, $N_2O$, $NH_3$ and mixtures thereof which is subject to inflow into the reaction chamber at a flow rate ranging from 1 to 1000 sccm.

8. The method according to claim 7, wherein the inert gas is selected from the group consisting of $N_2$, Ar, Xe and mixtures thereof.

9. The method according to claim 1, wherein forming the second dielectric film is performed by a MOCVD method under the conditions of:

1) at a chamber temperature ranging from 250 to 750° C.;
2) using a source selected from the group consisting of $Ta(OC_2H_5)_5$, $Ba(METHD)_2$, $Sr(METHD)_2$, $Ti(MPD)(THD)_2$ and mixtures thereof which is subject to inflow into a reaction chamber at a flow rate ranging from 0.001 to 0.1 g/min;
3) using an inert gas as a carrier gas which is subject to inflow into the reaction chamber at a flow rate ranging from 10 to 1000 sccm as a carrier gas; and
4) using a reactant gas selected from the group consisting of $O_2$, $N_2$, $N_2O$, $NH_3$ and mixtures thereof which is subject to inflow into the reaction chamber at a flow rate ranging from 1 to 1000 sccm.

10. The method according to claim 9, wherein the inert gas is selected from the group consisting of $N_2$, Ar, Xe and mixtures thereof.

11. The method according to claim 1, further comprising a step of performing a thermal treatment process onto the dielectric film after the step (b), using at least one process selected from the group consisting of plasma treatment, UV-$O_3$ treatment, RTP annealing, furnace annealing and combinations thereof.

12. The method according to claim 1, wherein the step (b) is repeatedly performed more than 2 times.

13. A method for forming a capacitor having a Ru storage electrode on a semiconductor device comprising:

(a) forming and selectively patterning a sacrificial layer on a semiconductor substrate to form a trench;
(b) forming a diffusion barrier layer and a storage electrode on the resultant structure;
(c) forming dielectric films on the storage electrode, the dielectric films comprising a stacked structure of a first dielectric film and a second dielectric film formed at a different deposition rate from the first dielectric film; and
(d) forming an upper electrode on the surface of the dielectric film.

14. The method according to claim 13, wherein a ratio of deposition rate of the first dielectric film: the second dielectric film falls within the range of 1:1.5~10.

15. The method according to claim 13, wherein the deposition rate of the first dielectric film ranges from 1 to 10 Å/min.

16. The method according to claim 13, wherein a deposition rate of the second dielectric film ranges from 5 to 50 Å/min.

17. The method according to claim 13, wherein a partial pressure of source gas in the formation process of the first dielectric film is lower than that of source gas in the formation process of the second dielectric film.

18. The method according to claim 17, wherein a ratio of a partial pressure of source gas in the formation process of the first dielectric film:the second dielectric film falls within the range of 1:1.5~100.

19. The method according to claim 13, wherein forming the first dielectric film is performed by a MOCVD method under the conditions of:

1) at a chamber temperature ranging from 250 to 750° C.;
2) using a source selected from the group consisting of $Ta(OC_2H_5)_5$, $Ba(METHD)_2$, $Sr(METHD)_2$, $Ti(MPD)(THD)_2$ and mixtures thereof which is subject to inflow into a reaction chamber at a flow rate ranging from 0.001 to 0.1 g/min;
3) using an inert gas as a carrier gas which is subject to inflow into the reaction chamber at a flow rate ranging from 20 to 6000 sccm; and
4) using a reactant gas selected from the group consisting of $O_2$, $N_2$, $N_2O$, $NH_3$ and mixtures thereof which is subject to inflow into the reaction chamber at a flow rate ranging from 1 to 1000 sccm.

20. The method according to claim 19, wherein the inert gas is selected from the group consisting of $N_2$, Ar, Xe and mixtures thereof.

21. The method according to claim 13, wherein forming the second dielectric film is performed by a MOCVD method under the conditions of:

1) at a chamber temperature ranging from 250 to 750° C.;
2) using a source selected from the group consisting of $Ta(OC_2H_5)_5$, $Ba(METHD)_2$, $Sr(METHD)_2$, $Ti(MPD)(THD)_2$ and mixtures thereof which is subject to inflow into a reaction chamber at a flow rate ranging from 0.001 to 0.1 g/min;
3) using an inert gas as a carrier gas which is subject to inflow into the reaction chamber at a flow rate ranging from 10 to 1000 sccm as a carrier gas; and
4) using a reactant gas selected from the group consisting of $O_2$, $N_2$, $N_2O$, $NH_3$ and mixtures thereof which is subject to inflow into the reaction chamber at a flow rate ranging from 1 to 1000 sccm.

22. The method according to claim 21, wherein the inert gas is selected from the group consisting of $N_2$, Ar, Xe and mixtures thereof.

23. The method according to claim 13, further comprising a step of performing a thermal treatment process onto the dielectric film after the step (c), using at least one process selected from the group consisting of plasma treatment, UV-$O_3$ treatment, RTP annealing, furnace annealing and combinations thereof.

24. The method according to claim 13, wherein the step (c) is repeatedly performed more than 2 times.

* * * * *